United States Patent

Guegnaud et al.

[11] Patent Number: 5,901,349
[45] Date of Patent: May 4, 1999

[54] MIXER DEVICE WITH IMAGE FREQUENCY REJECTION

[75] Inventors: Hervé Guegnaud, Maurepas; Michel Robbe, Conflans Sainte Honorine, both of France

[73] Assignee: Matra Communication, Quimper, France

[21] Appl. No.: 08/764,635

[22] Filed: Dec. 11, 1996

[30] Foreign Application Priority Data

Dec. 15, 1995 [FR] France .................................. 95 14927

[51] Int. Cl.⁶ ...................................................... H04B 1/30
[52] U.S. Cl. ........................ 455/302; 455/304; 455/306; 455/324; 455/285
[58] Field of Search .................................... 455/285, 293, 455/295, 296, 302, 303, 304, 305, 306, 313, 314, 324, 209, 280, 283, 288, 291, 292; 375/269, 279, 272, 316, 322, 324, 334; 329/323, 324, 346

[56] References Cited

U.S. PATENT DOCUMENTS

| | | | |
|---|---|---|---|
| 4,696,055 | 9/1987 | Marshall | 455/302 |
| 4,696,113 | 9/1987 | Rother et al. | 455/306 |
| 4,910,800 | 3/1990 | Chung | 455/304 |
| 4,955,039 | 9/1990 | Rother et al. | |
| 5,179,731 | 1/1993 | Trankle et al. | 455/304 |
| 5,212,825 | 5/1993 | Layton | 455/306 |

FOREIGN PATENT DOCUMENTS

| | | |
|---|---|---|
| 0 344 467 | 12/1989 | European Pat. Off. . |
| 0 573 247 | 12/1993 | European Pat. Off. . |
| 2 625 630 | 7/1989 | France . |

*Primary Examiner*—Nguyen Vo
*Assistant Examiner*—Lester G. Kincaid
*Attorney, Agent, or Firm*—Evenson, McKeown, Edwards & Lenahan, P.L.L.C.

[57] ABSTRACT

The device forms first and second signals by mixing the input radio signal with two respective quadrature waves of frequency $f_O$. An algebraic sum of these two signals is phase-shifted by $\pm 45°$ or $\pm 135°$ at an intermediate frequency $f_I$. An output signal is formed by an algebraic sum between the phase-shifted signal and the first or second signal, in such a way that, at the intermediate frequency $f_I$, the output signal has a phase representative of that possessed by the input radio signal at a communication frequency $f_C$ of the form $f_O-f_I$ or $f_O+f_I$, with rejection of the phase of the input radio signal at the image frequency $2f_O-f_C$.

15 Claims, 8 Drawing Sheets

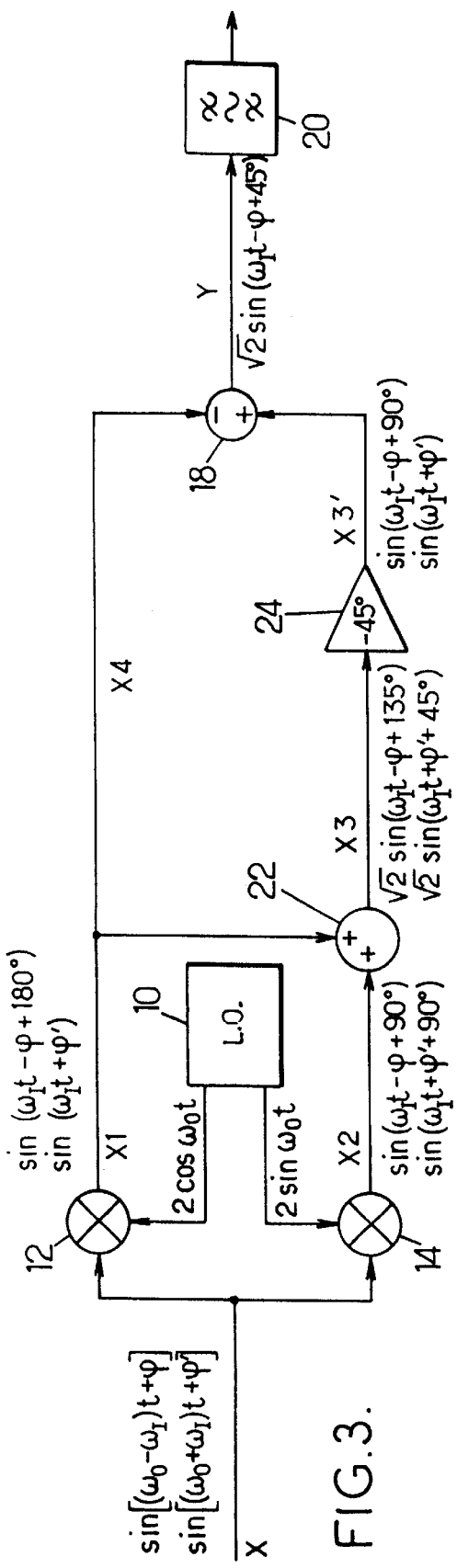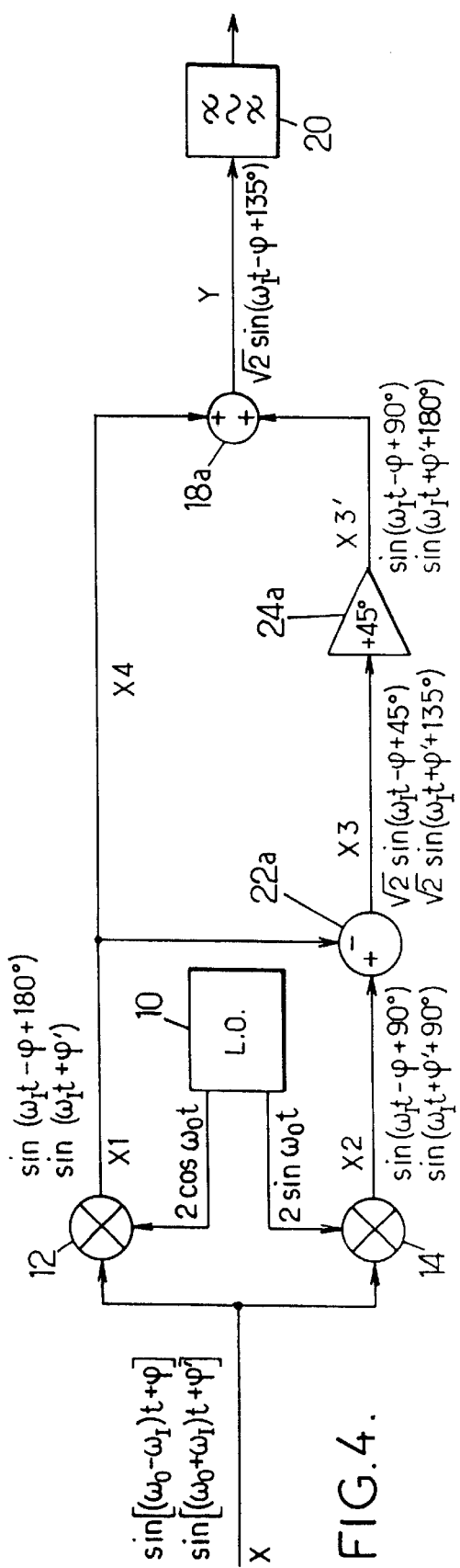

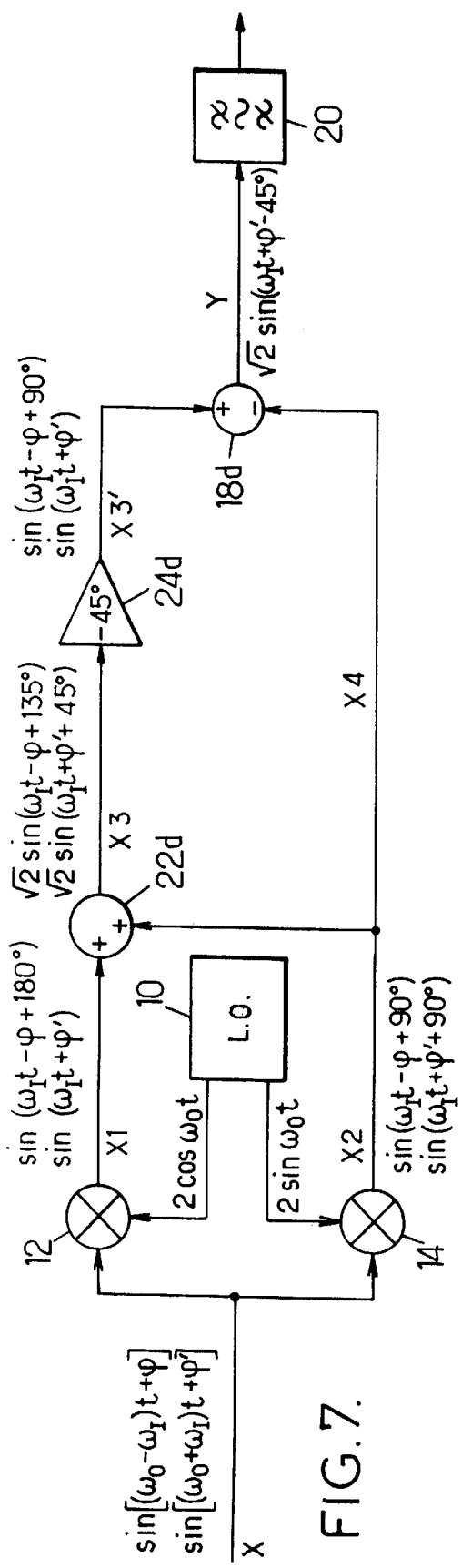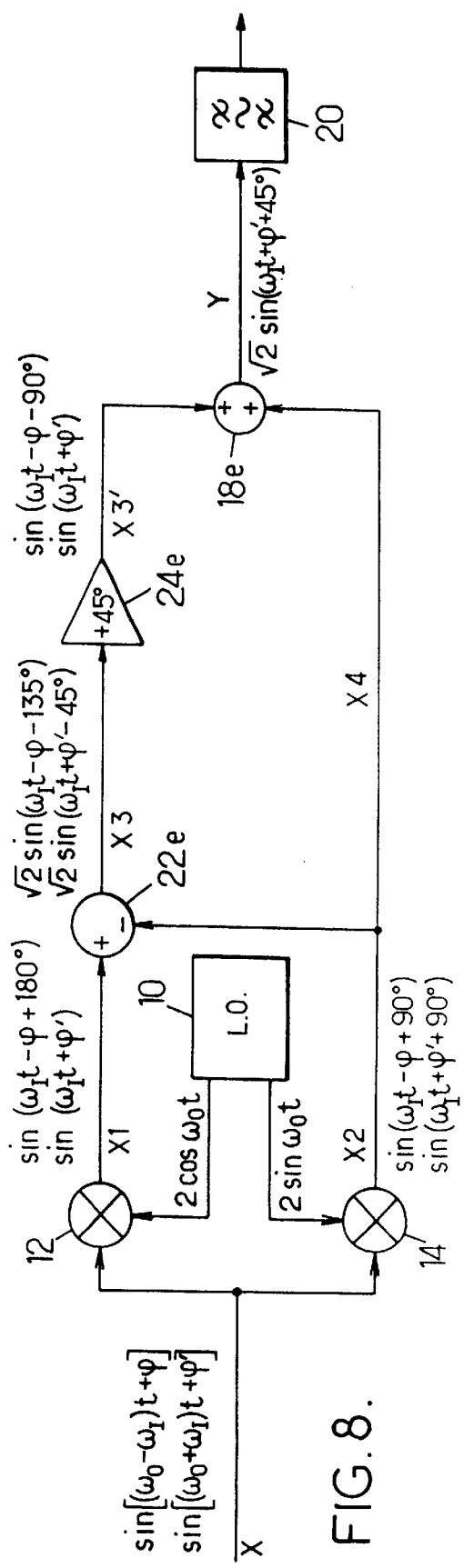

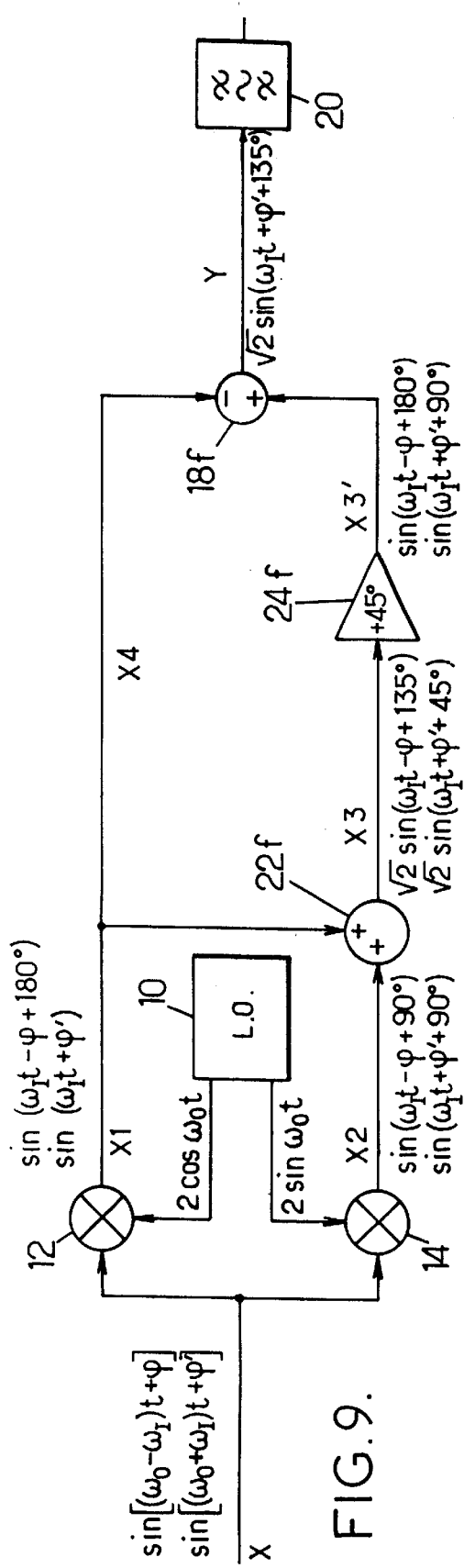
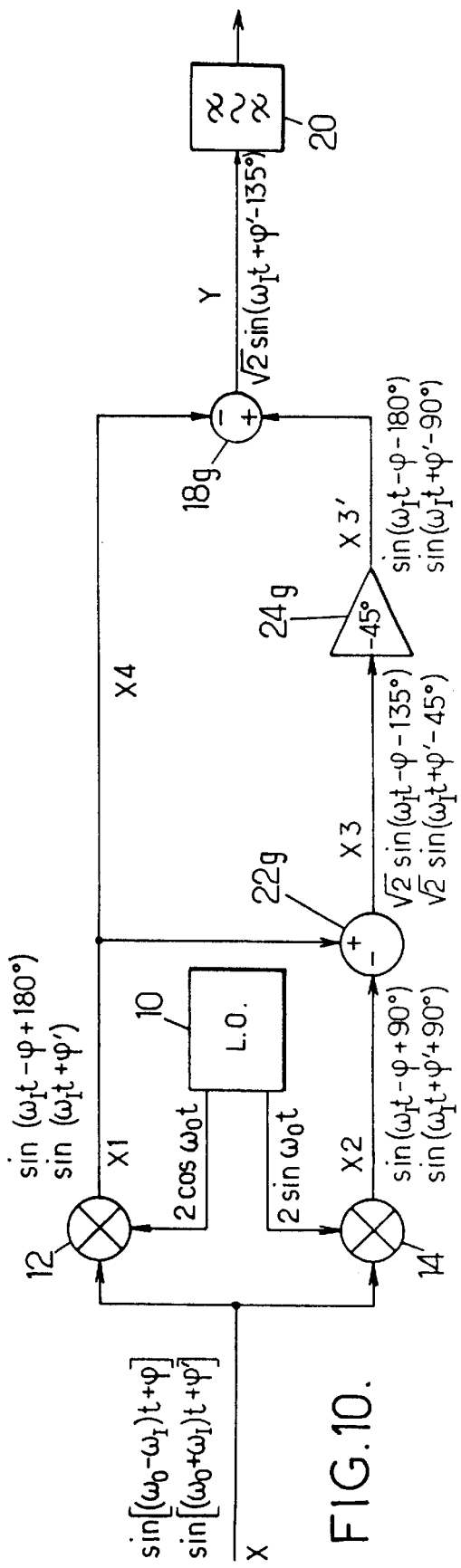
FIG. 9.
FIG. 10.

MIXER DEVICE WITH IMAGE FREQUENCY REJECTION

BACKGROUND OF THE INVENTION

The present invention relates to a mixer device for processing a radio signal. Such a device can in particular be used in the first receiving stage of a radio communication receiver. The radio signal processed can be a phase shift keying (PSK) or frequency shift keying (FSK) signal (FSK modulations may be regarded as particular cases of PSK modulations).

The mixer device serves to extract at an intermediate frequency $f_I$ a modulated phase exhibited by the radio signal received at a communication frequency $f_C$. To do this, use is made of a transposition frequency $f_O$ delivered by a local oscillator, equal to the sum or the difference between the communication frequency $f_C$ and the intermediate frequency $f_I$. However, the radio signal picked up generally has a wide spectrum, and possesses a priori components at the frequency $f_O+f_I$ and at the frequency $f_O-f_I$. One of these two frequencies is the desired communication frequency $f_C$, whilst the other is an image frequency $2f_O-f_C$ which the device must reject in order for its phase not to disturb the modulated phase at the frequency $f_C$ which it is sought to extract.

FIG. 1 shows a conventional arrangement of an image frequency rejection device. A local oscillator 10 delivers two quadrature waves at the transposition frequency $f_O=\omega_I/2\pi$, which are each mixed with the input signal X by respective mixers 12, 14. With regard to the intermediate frequency $f_I=\omega_I/2\pi$, the radio signal X possesses two components to be considered, one written $\sin[(\omega_O-\omega_I)t+\phi]$ and the other written $\sin[(\omega_O+\omega_I)t+\phi']$. It is assumed here that the desired communication frequency $f_C$ is $(\omega_O-\omega_I)/2\pi$ and that the frequency $(\omega_O+\omega_I)/2\pi$ is the undesirable image frequency. The modulated phase which it is sought to extract is then the phase $\phi$. The output signal X1 from the mixer 12, resulting from the mixing of the radio signal X with the wave $2\cos\omega_O t$ possesses two components at the intermediate frequency $f_I$: one having the phase $-\phi+180°$ and the other having the phase $\phi'$. The output signal X2 from the mixer 14, resulting from the mixing of the radio signal X with the wave $2\sin\omega_O t$ which has a phase lag of 90° with respect to the wave $2\cos\omega_O t$, likewise possesses two components at the intermediate frequency: one having the phase $-\phi+90°$ and the other having the phase $\phi'+90°$. A phase-shifter filter 16 applies a 90° phase lag at the intermediate frequency to the signal X2 so as to produce a signal X2' having, at the intermediate frequency, a component of phase $-\phi$ and a component of phase $\phi'$. A subtractor 18 deducts the signal X1 from this phase-shifted signal X2'. The undesirable phase $\phi'$ is thus eliminated from the output signal Y from the subtractor 18. Only the desired phase $\phi$ remains (bearing a minus sign in this particular case). The output signal Y is applied to a band-pass filter 20 which lets through the components with frequency close to the intermediate frequency $f_I$ so as to extract the desired phase.

The major drawback of the device represented in FIG. 1 is the need for a 90° phase-shifter requiring two poles and generally having to be embodied in the form of discrete components. Furthermore, the paths followed by the two signals combined by the subtractor 18 are not identical, this affecting the effectiveness of the rejection.

In order to reduce the impact of these problems, it has been proposed to replace the 90° phase-shifter with two ±45° phase-shifters. FIG. 2 shows such an arrangement. The phase-shifter 15 applies a 45° phase lead to the signal X1 so as to produce a signal X1" having, at the intermediate frequency, a component of phase $-\phi+225°$ and a component of phase $\phi'+45°$. The phase-shifter 17 applies a 45° phase lag to the signal X2 to produce a signal X2" having, at the intermediate frequency, a component of phase $-\phi+45°$ and a component of phase $\phi'+45°$. The output signal $Y=X2"-X1"$ from the subtractor 18 then possesses at the intermediate frequency a single component of phase $-\phi+45°$, that is to say containing the useful information. It is noted that the amplitude of this signal Y is smaller than that obtained with the layout of FIG. 1, given the $\sqrt{2}$ attenuation afforded by the ±45° phase-shifters 15, 17.

The device of FIG. 2 improves on that of FIG. 1, especially in that it can be embodied in the form of an integrated circuit. However, it is not free of drawbacks. In particular, the construction of the two RC networks making up the phase-shifter filters 15, 17 is tricky. The matching of these two networks is tricky and requires compensations. In general, one of the capacitances is not floating and it is therefore necessary to take account of its stray capacitance, for example by placing follower stages with low output impedance upstream of the phase-shifter filters. To obtain sufficiently effective rejection, the phase-shifter networks usually have to be tuned by means of digital/analog converters. Furthermore, the device has constantly to adapt to changes in the environment (temperature, supply voltage, etc.) so as to optimize image rejection.

An object of the present invention is to propose a simplified structure for a mixer device with image frequency rejection which can be embodied entirely in the form of an integrated circuit.

SUMMARY OF THE INVENTION

The invention thus proposes a mixer device with image frequency rejection, comprising mixing means for form-ing a first signal by mixing an input radio signal with a first wave of frequency $f_O$ delivered by a local oscillator and a second signal by mixing the input radio signal with a second wave of frequency $f_O$ delivered by the local oscilla-tor and having a phase lag of 90° with respect to said first wave, and means of algebraic summation of third and fourth mutually phase-shifted signals obtained from said first and second signals, in order to produce an output signal possessing, at the intermediate frequency $f_I$, a phase repre-sentative of the phase possessed by the input radio signal at a communication frequency $f_C$ of the form $f_O-f_I$ or $f_O+f_I$, with rejection of the phase which the input radio signal may possess at the image frequency $2f_O-f_C$. According to the invention, the device further comprises phase-shifter means producing said third signal by filtering an algebraic sum of the first and second signals with a transfer function A(f), and means for producing said fourth signal by applying to one of said first and second signals a transfer function B(f) such that, at the intermediate frequency $f_I$, the ratio $A(f_I)/B(f_I)$ has modulus $1/\sqrt{2}$ and argument ±45° or ±135°.

The "algebraic sum" of two signals is understood here to mean the sum or the difference of the two signals in question.

BRIEF DESCRIPTION OF THE DRAWINGS

FIGS. 3 to 10 are schematic layouts of eight mixer devices according to the invention.

DESCRIPTION OF PREFERRED EMBODIMENTS

Figure 1:
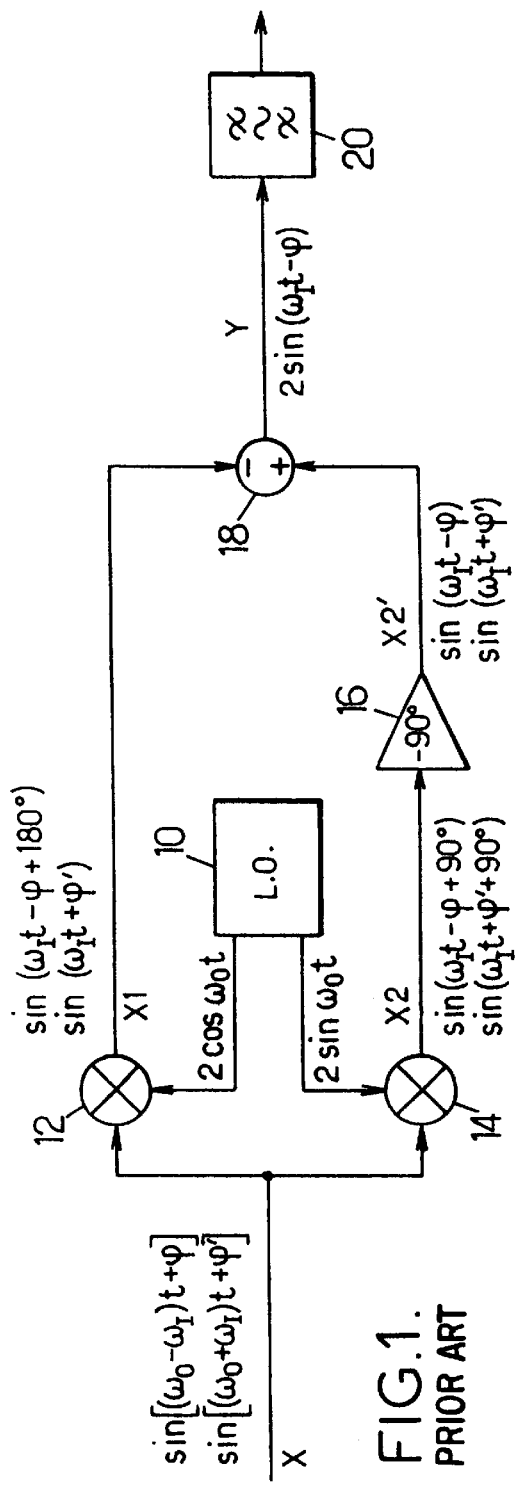
FIGS. 1 and 2 are schematic layouts of mixer devices with image frequency rejection of the prior art.
Figure 2:
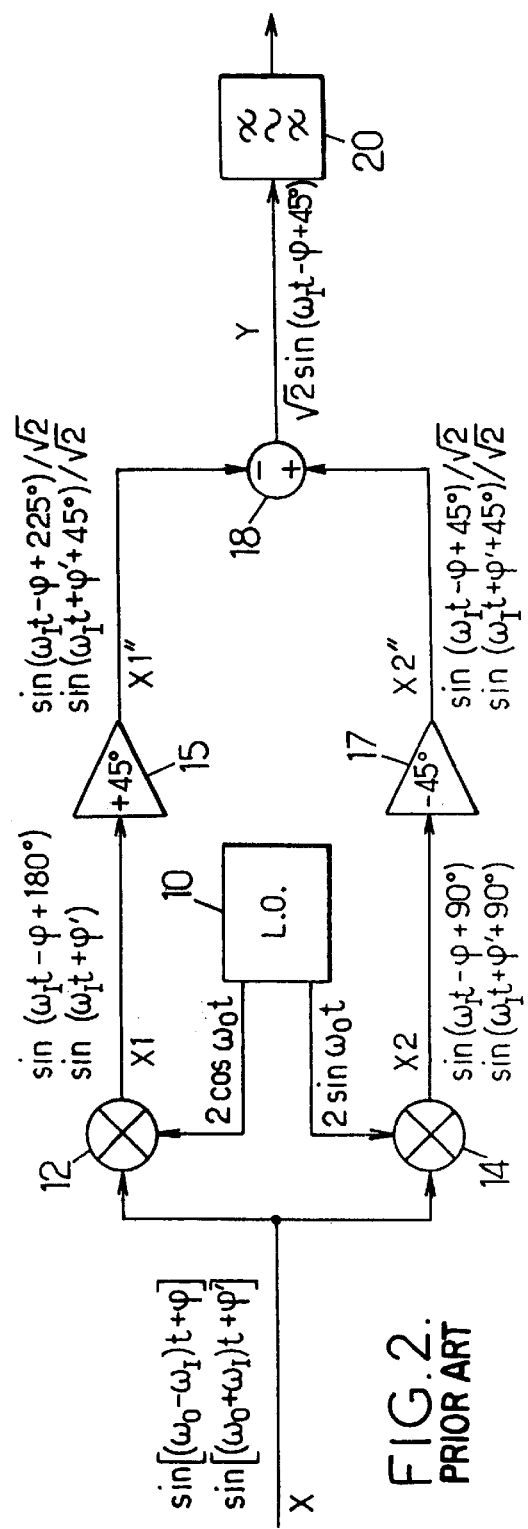

In FIGS. 3 to 10 the same numerical references as in FIGS. 1 and 2 have been used to denote identical ele-ments, especially the local oscillator 10 and the mixers 12, 14. To facilitate comparison with FIGS. 1 and 2, the case is considered, in respect of FIGS. 3 to 10, in which the transfer function referred to above as B(f) is equal to 1.

In the device represented in FIG. 3, an adder 22 produces the sum X3 of the first signal X1 delivered by the mixer 12 and of the second signal X2 delivered by the mixer 14. The signal X3 has a gain of $2\sqrt{2}$ at the intermediate frequency, given that it corresponds to a sum of two quadrature vectors. At the intermediate frequency $f_I$, the signal X3 possesses a phase of $-\phi+135°$ and a phase of $\phi'+45°$. A phase-shifter filter 24 applies a phase-shift to the signal X3 to produce a signal X3'. This phase-shift corresponds to a 45° phase lag at the intermediate frequency $f_I$, so that the signal X3' possesses, at the intermediate frequency $f_I$, a phase of $-\phi+90°$ and a phase of 100 '. The $\sqrt{2}$ attenuation introduced by the phase-shifter filter 24 at the intermediate frequency compensates for the gain of $\sqrt{2}$ of the signal X3. The subtractor 18 effects the difference between the signal X3', and a signal X4=B(f) .X1=X1. In this difference Y, the undesirable phase $\phi'$ has been eliminated. There remains, at the intermediate frequency $f_I$, only the phase $-\phi+45°$, with a gain of $\sqrt{2}$, given that the subtractor 18 effects a sum of two quadrature signals $\sin(\omega_I t+\phi)$ and $\sin(\omega_I t-\phi+90°)$. The output signal Y from the mixer device can next be applied to the band-pass filter 20 for subsequent processing operations.

In the device represented in FIG. 4, the adder 22 is replaced by a subtractor 22a producing the difference X3=X2−X1, the phase-shifter filter 24a introduces a +45° phase lead at the intermediate frequency so as to produce the signal X3' from the difference signal X3, and the subtractor 18 is replaced by an adder 18a producing Y=X3'+X4=X3'+X1. In this case, the signal X3 possesses, at the intermediate frequency, phases $-\phi+45°$ and $\phi'+135°$, so that the phase-shifted signal X3' possesses, at the intermediate frequency, the phases $-\phi+90°$ and $\phi'+180°$. As a consequence, the undesirable phase $\phi'$ is eliminated from the output signal Y, which, at the intermediate frequency, has only the phase $-\phi+135°$ representative of the phase $\phi$ possessed by the input signal X at the communication frequency $f_C=f_O-f_I$.

Figure 5:
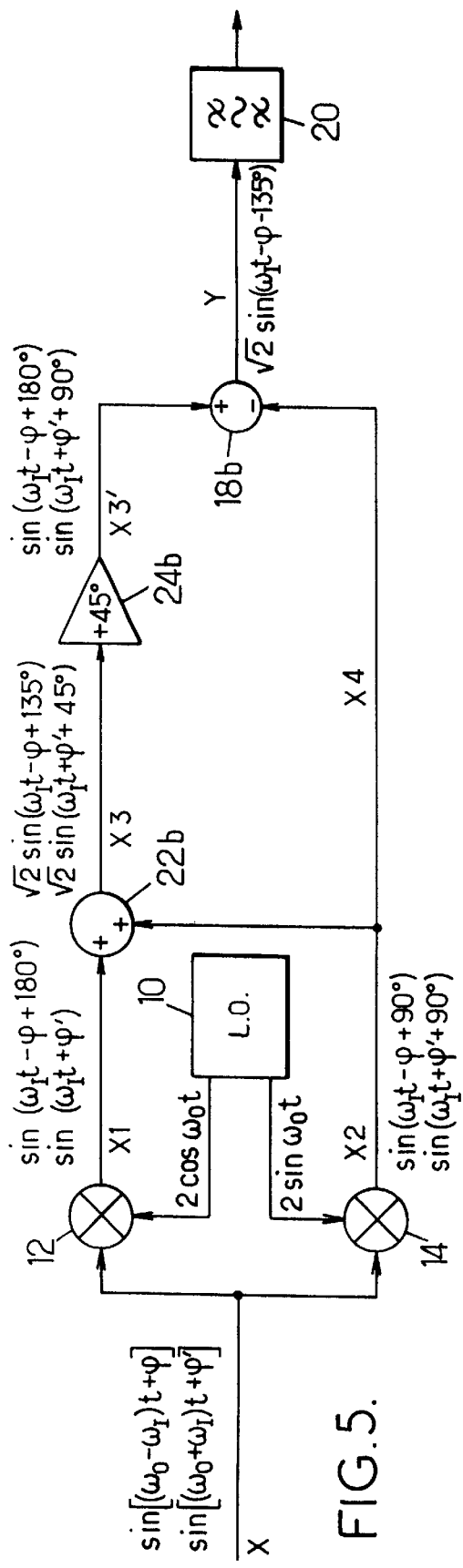

In the device schematized in FIG. 5, the adder 22b produces the signal X3=X1+X2 possessing, at the intermediate frequency, the phases $-\phi 135°$ and $\phi'45°$. The phase-shifter filter 24b applies a +45° phase-shift to the signal X3 to produce a signal X3' having, at the intermediate frequency, the phases $-\phi+180°$ and $\phi'+90°$. The subtractor 18b produces an output signal Y=X3'−X4=X3'−X2 possessing only the phase $-\phi-135°$ at the intermediate frequency.

Figure 6:
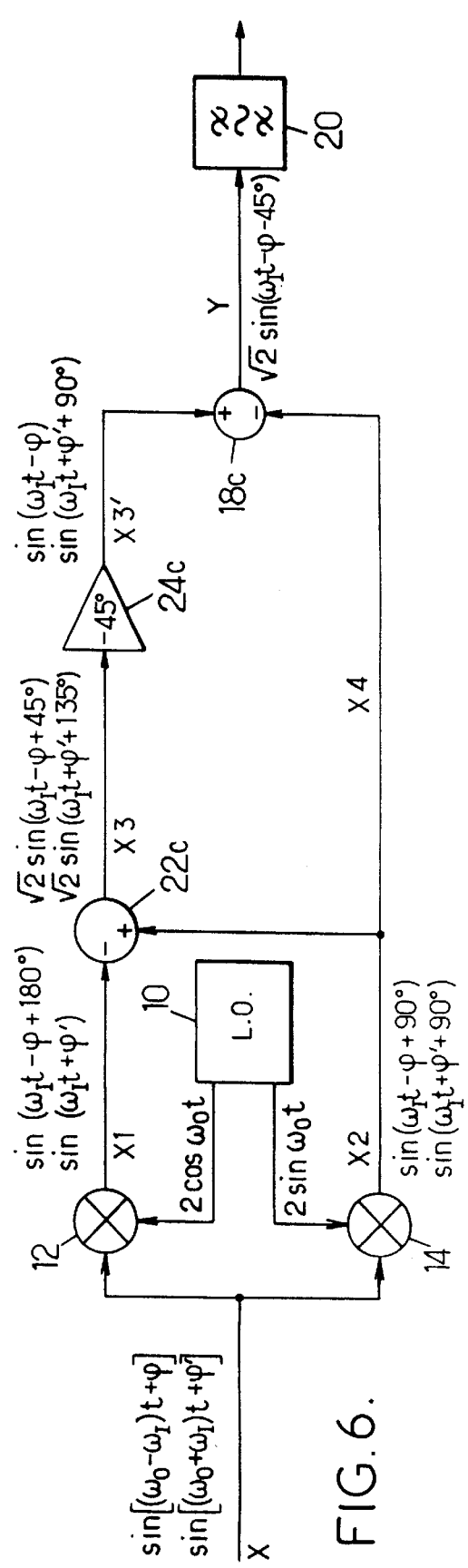

In the device represented in FIG. 6, the subtractor 22c produces the signal X3=X2−X1 possessing, at the intermediate frequency, the phases $-\phi+45°$ and $\phi'+135°$. The phase-shifter 24c applies a −45° phase-shift to the signal X3 at the intermediate frequency to produce a signal X3' having, at the intermediate frequency, the phases $-\phi$ and $\phi'+90°$. The subtractor 18c produces an output signal Y=X3'−X4=X3'−X2 possessing only the phase $-\phi-45°$ at the intermediate frequency.

In the explanations given above with reference to FIGS. 3 to 6, the "first signal" X1 was obtained by mixing with the input radio signal X a wave $2\cos\omega_O t$ having a phase lead of 90° with respect to the wave $2\sin\omega_O t$ mixed with the input radio signal to form the "second signal" X2. This makes it possible to extract at the intermediate frequency a phase representative of the phase $\phi$ possessed by the input radio signal at a communication frequency $f_C=f_O-f_I$ while rejecting the image frequency $2f_O-f_C=f_O+f_I$.

In the case in which the communication frequency $f_C$ is of the form $f_O+f_I$, it is the phase $\phi'$ which it is sought to extract at the intermediate frequency, while eliminating the image frequency $2f_O-f_C=f_O-f_I$. In this case, it is appropriate to permute the roles of the signals X1 and X2.

FIGS. 7 to 10 are thus layouts of devices respectively similar to those of FIGS. 3 to 6, in which the roles of the signals X1 and X2 have been permuted in the combinations performed in order to deliver the output signal Y, and therefore appropriate in respect of a communication frequency $f_C=f_O+f_I$ with rejection of the image frequency $f_O-f_I$.

In the device of FIG. 7, the phase-shifter 24d retards by 45° the phase of the signal X3=X1+X2 produced by the adder 22d. The subtractor 18d subtracts the signal X4=X2 from the output X3' from the phase-shifter 24d so that the output signal Y has only the phase $\phi'-45°$ at the intermediate frequency.

In the device of FIG. 8, the phase-shifter 24e advances by 45° the phase of the signal X3=X1−X2 produced by the subtractor 22e. The adder 18e adds the signal X4=X2 to the output X3' from the phase-shifter 24e so that the output signal Y has only the phase $\phi'+45+$ at the intermediate frequency.

In the device of FIG. 9, the phase-shifter 24f advances by 45° the phase of the signal X3=X1+X2 produced by the adder 22f. The subtractor 18f subtracts the signal X4=X1 from the output X3' from the phase-shifter 24f so that the output signal Y has only the phase $\phi'+135°$ at the intermediate frequency.

In the device of FIG. 10, the phase-shifter 24g retards by 45° the phase of the signal X3=X1−X2 produced by the adder 22g. The subtractor 18g subtracts the signal X4=X1 from the output X3' from the phase-shifter 24g so that the output signal Y has only the phase $\phi'-135°$ at the intermediate frequency.

In the general case, when the communication frequency $f_C$ is of the form $f_O-f_I$, the combination applied to the signals X1 and X2 to produce the output signal Y is such that Y is the real part of a complex signal proportional to $(X1+X2)e^{-j\pi/4}/\sqrt{2}-X1$ (FIG. 3), to $(X2-X1)e j\pi/4/\sqrt{2}+X1$ (FIG. 4), to $(X1+X2)e^{j\pi/4}/\sqrt{2}-X2$ (FIG. 5), or to $(X2-X1)e^{-j\pi/4}/\sqrt{2}-X2$ (FIG. 6). FIGS. 3 to 6 correspond to the case in which the constant of proportionality is equal to 1. In the general case, this constant of proportionality can be any complex number $B(f_I)$.

When the communication frequency $f_C$ is of the form $f_O+f_I$, the combination applied to the signals X1 and X2 to produce the output signal Y is such that Y is the real part of a complex signal proportional to $(X1+X2)e^{-j\pi/4}/\sqrt{2}-X2$ (FIG. 7), to $(X1-X2)e^{j\pi/4}/\sqrt{2}+X2$ (FIG. 8), to $(X1+X2)e^{j\pi/4}/\sqrt{2}-X1$ (FIG. 9) or to $(X1-X2)e^{-j\pi/4}/\sqrt{2}-X1$ (FIG. 10). FIGS. 7 to 10 correspond to the case in which the constant of proportionality is equal to 1. In the general case, this constant of proportionality can be any complex number B $(f_I)$.

As $e^{3j\pi}/4=-e^{-j\pi/4}$ and $e^{-3j\pi/4}=-e^{j\pi/4}$, the aforesaid phase-shifts, obtained via ±45° phase-shifter filters at the intermediate frequency in the layouts of FIGS. 3 to 10, could also be obtained via ±135° phase-shifter filters at the intermediate frequency, through a corresponding modification of the signs in the algebraic sums.

Figure 11:
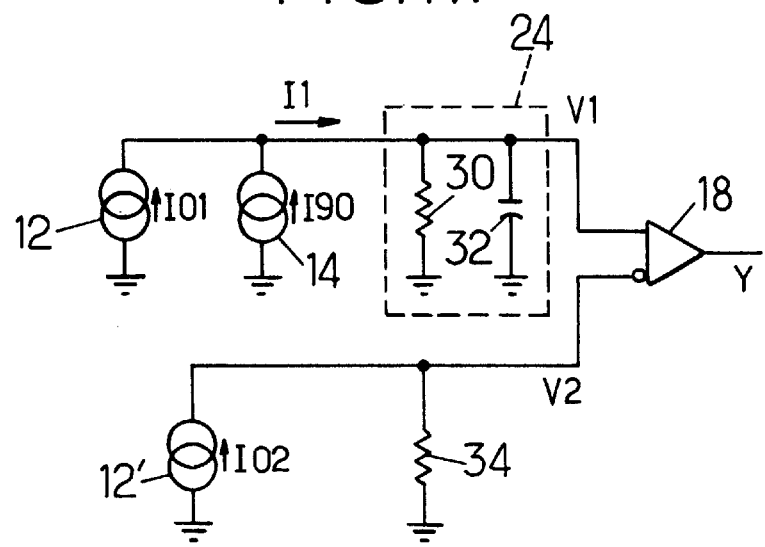
FIG. 11 is a basic layout of a device of the type shown in FIG. 3.

FIG. 11 shows a basic layout of an embodiment of a mixer device according to FIG. 3, in which the first and second signals X1, X2 are produced in the form of current signals. In FIG. 11, the mixers 12, 14 are schematized by current generators yielding currents I01 and I90 of like amplitude I0 and corresponding respectively to the signals X1 and X2. There is provision for a duplication of the generator 12. Thus, the generator 12' yields a current I02 equal to the current I01. The sum I1=I01+I90 of the currents produced by the generators 12, 14, which represents the signal X3, is applied to a first common terminal of a resistor 30 and a capacitor 32 making up the phase-shifter filter 24. The resistor 30 and the capacitor 32 are mounted in parallel between this first terminal and a second terminal taken to a reference potential, for example a positive potential or, as represented, the ground potential. The ohmic value R of the resistor 30 and the capacitance C of the capacitor 32 are adjusted so as to satisfy the relation $RC\omega_{I}=1$, so that the RC filter 24 introduces a 45° phase lag at the intermediate frequency $f_I=\omega_I/2\pi$ between the voltage V1 at the first terminal, which represents the signal X3', and the current I1 injected by the generators 12, 14 at this first terminal. In complex notation, we have V1=R.I1/(1+j) at the intermediate frequency, i.e. $X3'=R.X3.e^{-j\pi/4}/\sqrt{2}$. The device further includes a resistor 34 with the same ohmic value R as the first resistor 30, connected between the second terminal at the reference potential and a third terminal at which the current I02 produced by the generator 12' is injected. The voltage V2=R.I02 present at this third terminal, which represents the signal X4, is therefore in phase with the signal X1 which the current I02 represents: X4=R.X1. The subtractor 18 then produces the signal $Y=R[(X1+X2)e^{-j\pi/4}/\sqrt{2}-X1]$ by differencing the voltage signals V1 and V2. The transfer functions A(f) and B(f) are in this case impedances such that B(f)=R and $A(f_I)=R.e^{-j\pi/4}/\sqrt{2}$.

Figure 12:
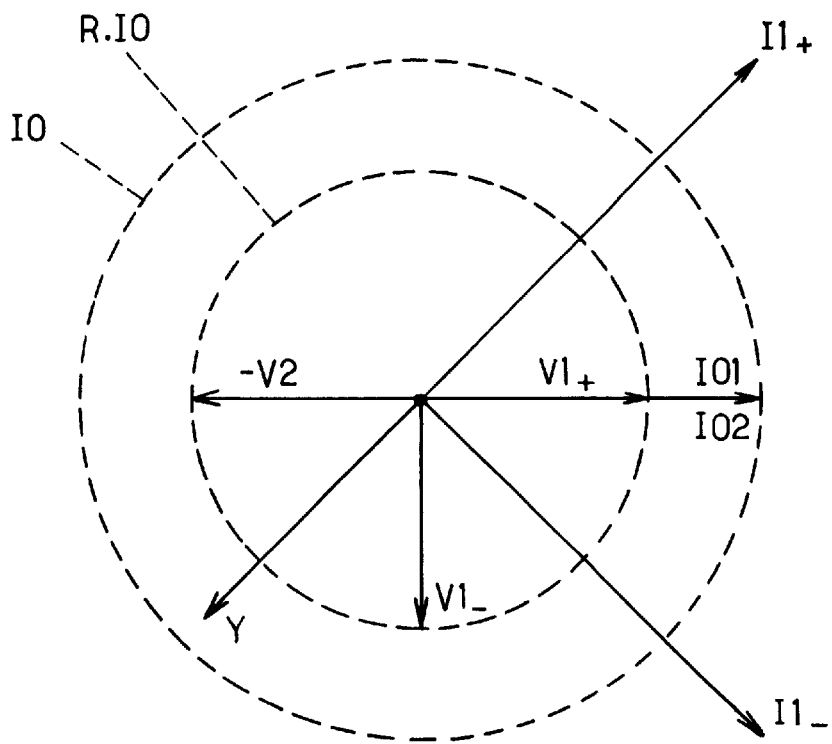
FIG. 12 is a phase diagram illustrating the operation of the device of FIG. 11.

If, at the intermediate frequency $f_I$, the current I90 has a phase lead of 90° with respect to the currents I01 and I02, the current I1$_+$=I01$_+$I90=(1+j)I01 exhibits a +45° phase-shift with respect to the currents I01 and I02 (FIG. 12). The voltage V1$_+$=R.I1$_+$/(1+j)=R.I01 which results from this then has the same amplitude and the same phase as the voltage V2, so that these two voltages are cancelled out on output from the subtractor 18. This situation is that of the components sin($\omega_I t+\phi'$) and sin($\omega_I t+\phi'+90°$) of the signals X1 and X2 (FIG. 3).

If, at the intermediate frequency $f_I$, the current I90 has a phase lag of 90° with respect to the currents I01 and I02, the sum I1$_{3I}$=I01+I90=(1−j)I01 exhibits a −45° phase-shift with respect to the currents I01 and I02. The voltage V1$_-$=R.I1$_-$/(1+j)=−j.I01 which results from this then has the same amplitude as the voltage V2, with a phase-shift of −90° (FIG. 12). The output signal Y=V1$_-$−V2 is then non-zero. In complex notation, Y=R.(−1−j).I01. This situation is that of the components sin($\omega_I t-\phi+180°$) and sin($\omega_I t-\phi+90°$) of the signals X1 and X2 (FIG. 3).

The basic layout of FIG. 11, depicted in the case of a mixer device according to claim 3, is manifestly transposable to mixer devices according to FIGS. 4 to 10.

It is therefore seen that a device according to the invention can be embodied in a particularly simple manner by using a phase-shifter filter consisting of a simple parallel RC network without floating capacitance, it being possible for the algebraic sum schematized by the summators 22, 22 a–g in FIGS. 3 to 10 to be embodied simply by injection of two currents at a terminal of this RC network.

Figure 13:
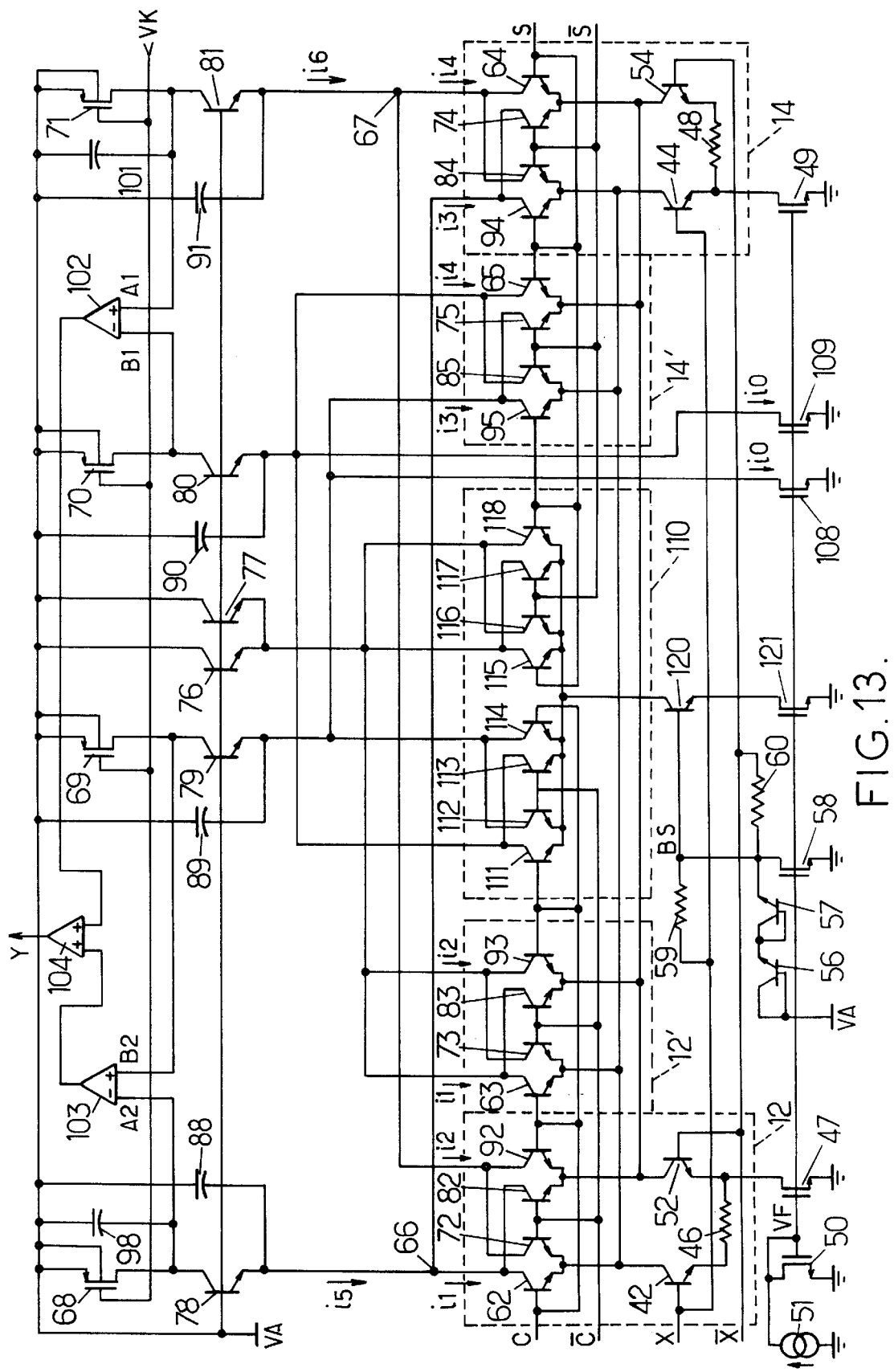
FIG. 13 is a detailed layout of a device according to FIG. 7.

FIG. 13 shows an embodiment of a mixer device according to FIG. 7, in which the signals are differential signals, the communication frequency being of the form $f_C=f_O+f_I$ (for example $f_O$=30.6 MHz, $f_I$=10.7 MHz and $f_C$=41.3 MHz). The mixers 12, 14 consist of Gilbert cells with npn transistors.

The cell 12 comprises a first stage of two npn transistors 42, 52 whose emitters are linked by a linearizing resistor 46 whose value could be zero, the base of the transistor 42 receiving the input radio signal X and the base of the transistor 52 receiving the additive inverse $\overline{X}$ of this signal X. The drain of an NMOS transistor 47 is linked to the emitter of the npn transistor 52. This transistor 47 is arranged so as to yield a constant current, for example of 60 μA. To do this, its source is grounded, and its gate is taken to a fixed voltage VF present on the common drain-gate connection of another NMOS transistor 50 biased to saturation, with its source grounded. A current generator 51 injects a stable current so as to bias the transistor 50. The cell 12 comprises a second stage of four npn transistors 62, 72, 82, 92. The emitters of the transistors 62, 72 are linked to the collector of the transistor 42, whilst the emitters of the transistors 82, 92 are linked to the collector of the transistor 52. The bases of the transistors 62 and 92 receive a sinusoidal voltage signal C at the frequency $f_O$ arising from the local oscillator (wave cos $\omega_O t$), whilst the bases of the transistors 72 and 82 receive a sinusoidal voltage signal $\overline{C}$ at the frequency $f_O$ arising from the local oscillator 10 and corresponding to the signal C phase-shifted by 180°. The collectors of the transistors 62 and 82 are linked together, as are those of the transistors 72 and 92.

With this arrangement, the Gilbert cell 12 yields the mixed signal X1 in the form of the difference between the current i1 arising from the collectors of the transistors 62, 82 and the current i2 arising from the collectors of the transistors 72, 92: X1=i1−i2. This differential signal X1 is proportional to X.cos $\omega_O t$.

The cell 14 has a structure similar to that of the cell 12, with a first stage of two npn transistors 44, 54 whose emitters are linked by a linearizing resistor 48, the base of the transistor 44 receiving the input radio signal X and the base of the transistor 54 receiving the signal $\overline{X}$. The drain of an NMOS transistor 49 identical to the transistor 47 is linked to the emitter of the npn transistor 44. This transistor 49 has its source grounded, and its gate receives the same constant voltage VF as that of the transistor 47. In order to balance the cells, the collectors of the transistors 42, 44 are linked together, as are the collectors of the transistors 52, 54. The cell 14 comprises a second stage of four npn transistors 64, 74, 84, 94. The emitters of the transistors 64, 74 are linked to the collector of the transistor 54, whilst the emitters of the transistors 84, 94 are linked to the collector of the transistor 44. The bases of the transistors 64 and 94 receive a sinusoidal voltage signal S at the frequency $f_O$ arising from the local oscillator 10 and corresponding to the signal C with a 90° phase lag (wave sin $\omega_O t$), whilst the bases of the transistors 74 and 84 receive a sinusoidal voltage signal S at the frequency $f_O$ and corresponding to the signal S phase-shifted by 180°. The collectors of the transistors 64 and 84 are linked together, as are those of the transistors 74 and 94.

With this arrangement, the Gilbert cell 14 yields the mixed signal X2 in the form of the difference between the current i3 arising from the collectors of the transistors 74, 94 and the current i4 arising from the collectors of the transistors 64, 84: X2=i3−i4. This differential signal X2 is proportional to X. sin $\omega_O$t, the constant of proportionality being the same as that of the differential signal X1 delivered by the cell 12.

For the biasing of the transistors 42, 52, 44, 54, the voltage signals X and $\overline{X}$ are superimposed on a DC voltage BS before being forwarded to the bases of the transistors 42, 44 and 52, 54. This voltage BS is produced by two npn transistors in series 56, 57 mounted as a diode. The transistor 56 has its collector and its base linked to a supply terminal at a positive voltage VA. The transistor 57 has its collector and its base linked to the emitter of the transis-tor 56, and its emitter linked to the drain of an NMOS transistor 58. The source of the transistor 58 is grounded and its gate is at the voltage VF. The voltage BS, present on the emitter of the transistor 57, is then BS=VA−2$V_{be}$, where $V_{be}$ is the base-emitter saturation voltage of the transistors 56, 57. In order to bias the transistors of the first stages of the Gilbert cells, the emitter of the transistor 57 is linked to the bases of the transistors 42, 44 and 52, 54 by way of respective biasing resistors 59 and 60.

In order to effect the addition schematized by the adder 22d in FIG. 7, the currents i1 and i3 are injected at a common node 66, and the currents i2 and i4 are injected at a common node 67. Thus, the signal X3 represented in FIG. 7 is the differential current signal corresponding to the difference between the current i5=i1+i3 issuing from the node 66 and the current i6=i2+i4 issuing from the node 67: X3=i5−i6.

In order to yield the second version of the signal X2, which version will be combined with the signal phase-shifted by 45°, the second stage of the Gilbert cell 14 is duplicated. There is thus provided a stage 14' consisting of four npn transistors 65, 75, 85, 95 connected in the same way as the transistors 64, 74, 84, 94 of the second stage of the cell 14. A second version of the currents i3 and i4 is thus available on the common connection of the collectors of the transistors 75, 95 and on the common connection of collectors of the transistors 65, 85.

For reasons of symmetry, a duplication of the second stage of the Gilbert cell 12 is also provided for. The stage 12' thus consists of four npn transistors 63, 73, 83, 93 connected in the same way as the transistors 62, 72, 82, 92 of the second stage of the cell 12. A second version of the currents i1 and i2 is thus available on the common connec-tion of the collectors of the transistors 63, 83 and on the common connection of collectors of the transistors 73, 93.

The mixer device of FIG. 13 further comprises four PMOS transistors 68, 69, 70, 71 biased so as to operate in their ohmic region, and four npn transistors 78, 79, 80, 81 in a cascode configuration. The sources of the PMOS transistors 68–71 and the bases of the npn transistors 78–81 are each at the positive supply voltage VA. The drains of the transistors 68, 69, 70, 71 are respectively linked to the collectors of the transistors 78, 79, 80, 81. The emitter of the transistor 78 receives the current i5 issuing from the node 66. The emitter of the transistor 79 receives the current i3 issuing from the collectors of the transistors 75, 95 of stage 14'. The emitter of the transistor 80 receives the current i4 issuing from the collectors of the transistors 65, 85 of stage 14'. The emitter of the transistor 81 receives the current i6 issuing from the node 67. The emitters of the transistors 78, 79, 80, 81 are moreover linked to the terminal at which the supply voltage VA is present, by way of respective filtering capacitors 88, 89, 90, 91.

The resistors of the channels of the transistors 68, 71 play a role similar to that of the resistor 30 of FIG. 11, whilst the channels of the transistors 69, 70 play a role similar to that of the resistor 34 in FIG. 11. The resistance values of these channels of the transistors 68–71 are fixed by an adjustment voltage VK forwarded to the gates of these transistors. The channels of the transistors 68, 71 are connected in parallel with respective capacitors 98, 101 playing the role of the capacitor 32 of FIG. 11.

The voltages on the drains of the PMOS transistors 71, 68, 70, 69 are denoted A1, A2, B1, B2 respectively. The differential voltage A1−A2 corresponds to the phase-shifted signal denoted X3' in FIG. 7, and the differential voltage B1−B2 corresponds to the signal denoted X4 in FIG. 7. The means corresponding to the subtractor 18d of FIG. 7 are arranged so as to yield the output signal Y given by Y=A1−A2−B1+B2. In the example represented in FIG. 13, these means comprise two differential amplifiers 102, 103 followed by an adder amplifier 104 delivering the signal Y. The differential amplifier 102 has a positive input receiving the voltage A1 and a negative input receiving the voltage B1, whilst the differential amplifier 103 has a positive input receiving the voltage B2 and a negative input receiving the voltage A2. The outputs of the two differential amplifiers 102, 103 are linked to the inputs of the adder amplifier 104.

With the circuit represented in FIG. 13, we have A1(f)=−$Z_A$(f).i6(f), A2(f)=−$Z_A$(f).i5(f), B1(f)=−$Z_B$(f).i4(f), and B2(f)=−$Z_B$(f).i3(f), where A1(f), A2(f), B1(f), B2(f), and i3 (f) to i6 (f) denote the Fourier components at the frequency f of the signals A1, A2, B1, B2 and i3 to i6, and $Z_A$(f), $Z_B$(f) denote the complex impedances:

$$Z_A(f) = \frac{R_0}{1 + 2\pi j R_0 (C_0 + C_p) f}$$

$$Z_B(f) = \frac{R_1}{1 + 2\pi j R_1 C_p f},$$

$R_0$ denoting the resistance of the channels of the PMOS transistors 68, 71, $R_1$ denoting the resistance of the channels of the PMOS transistors 69, 70, $C_O$ denoting the capacitance of the capacitors 98, 101, and $C_p$ denoting a stray capacitance due essentially to the collector of each of the npn transistors 78–81 ($C_p$ is a capacitance between a collector and the reference terminal at the voltage VA) . One of the reasons why the stage of cascoded transistors 78–81 is used is that it makes it possible to reduce these stray capacitances: each input of the differential amplifiers 102, 103 "sees" a single stray capacitance $C_p$ corresponding to the collector of the transistor 78–81 to which it is linked, instead of several if the inputs of the differential ampli-fiers were linked directly to the collectors of the transis-tors of the Gilbert cells. The value of the stray capaci-tance $C_p$ can be known with reasonable accuracy by means of simulations of the electronic behaviour of the integrated circuit (it is typically of the order of 10% of $C_O$), Since X3'(f)=A1(f)−A2(f)=$Z_A$(f).[i5(f)−i6(f)]=$Z_A$(f).X3 (f) and X4(f)=B1(f)−B2(f)=$Z_B$(f).[i3(f)−i4(f)]=$Z_B$(f).X2(f), the complex impedances $Z_A$(f) and $Z_B$(f) are the transfer functions A(f) and B(f) between the differential signals X3 and X3' and between the differential signals X2 and X4.

The values of the resistances $R_0$ and $R_1$ are chosen as follows:

$$R_0 = \frac{1}{2\pi f_I (C_0 - C_p)}$$

$$R_1 = \frac{1}{2\pi f_I C_0} = R_0 \left(1 - \frac{C_p}{C_0}\right)$$

so that at the intermediate frequency $f_I$, the transfer functions $A(f)$ and $B(f)$ are such that $A(f_I)/B(f_I)=(1-j)/2=e^{-j\pi/4}/\sqrt{2}$ with $B(f_I)=1/[2\pi f_I(C_O+jC_p)]$. Consequently, the output voltage Y has, at the frequency $f_I$, a component $Y(f_I)$ proportional to $$A1(f_I)-A2(f_I)-B1(f_I)+B2(f_I)=B(f_I)\cdot[X3(f_I)\cdot e^{-j\pi/4}/\sqrt{2}-X2(f_I)]$$

With the gates of the transistors 68–71 being fed with the same signal VK, the different values of the resistances $R_0$ and $R_1$ indicated above are obtained by providing, for the PMOS transistors 68, 71, a channel of equal length but of smaller width than the channel of the PMOS transistors 69, 70.

The circuit represented in FIG. 13 further includes means for balancing the DC voltages on the inputs of the differential amplifiers 102, 103. There are thus provided two NMOS transistors 108, 109 having their sources connected to ground, their gates connected to the voltage VF and their drains linked respectively to the emitters of the npn transistors 79, 80. These transistors inject a constant current $i_O$ into the emitters of the transistors 79, 80 so as to compensate for the fact that the resistance $R_1$ of the channels of the PMOS transistors 69, 70 is smaller than the resistance of the channels of the PMOS transistors 68, 71.

The capacitors 88–91 have substantially smaller capacitances than those of the capacitors 98 and 101. These capacitors 88–91 serve, with the input impedances (emitters) of the npn transistors 78, 81, to filter out high-frequency harmonics from the mixed signals so as not to disturb the inputs of the differential amplifiers 102, 103. The capacitance of the capacitors 89, 90 is a little larger than that of the capacitors 88, 91, so as to take into account the fact that the input impedance of the transistors 79, 80 is smaller than that of the transistors 78, 81.

The circuit moreover comprises a stage 110 of eight npn transistors 111–118 whose emitters are collectively linked to the collector of another npn transistor 120. The base of the transistor 120 receives the DC bias voltage BS and its emitter is linked to the drain of an NMOS transistor 121 with identical characteristics to those of the transistors 47, 49, whose source is grounded and whose gate receives the voltage VF. The bases of the transistors 111, 114 receive the wave C. The bases of the transistors 112, 113 receive the wave $\overline{C}$. The bases of the transistors 115, 118 receive the wave S. The bases of the transistors 116, 117 receive the wave $\overline{S}$. The collectors of the transistors 111, 113 are linked to the emitter of the npn transistor 80, whilst the collectors of the transistors 112, 114 are linked to the emitter of the npn transistor 79. This compensates for the fact that the emitters of the transistors 79, 80 are each linked to only two transistors of the Gilbert cells 12, 12', 14, 14' whereas the emitters of the transistors 78, 81 are linked to four transistors of the Gilbert cells 12, 12', 14, 14'. Two other npn transistors in cascode configuration 76, 77, having their collectors and their bases at the positive supply voltage VA, have their emitters linked to the collectors of the transistors 63, 73, 83, 93, 115, 116, 117, 118 so as to balance the circuit.

The high-frequency filtering carried out by the capacitors 88–91 and the injection of the currents $i_O$ and of the currents arising from the stage 110 have virtually no influence near the intermediate frequency $f_I$, so that they do not affect the complex impedances $Z_A$ and $Z_B$ at the frequency $f_I$.

It is noted that if the waves S and C (and $\overline{S}$ and $\overline{C}$) are permuted in the layout of FIG. 13, this being readily realizable by means of switches placed between the local oscillator and the mixer device, then the signal X1 is represented by i3–i4 and the signal X2 by i1–i2. With such a permutation, the device of FIG. 13 becomes suitable for a communication frequency of the form $f_C=f_O-f_I$ (cf. FIG. 3).

The fact of using variable resistors such as the channels of the MOS transistors 68–71 allows slaving of these resistors so as to compensate for any variations due to the manufacturing process or to outside parameters such as the temperature or the supply voltages.

Figure 14:
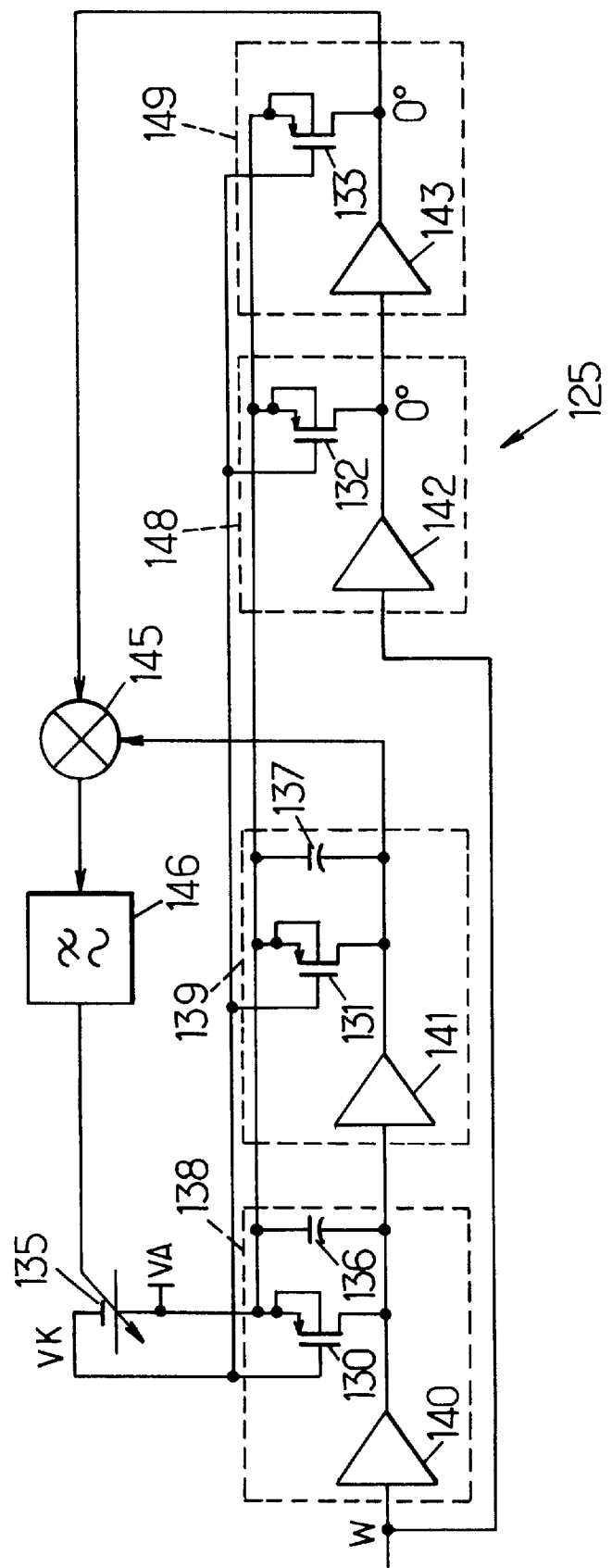
FIG. 14 is a layout of a slaving circuit which can be used with a device according to FIG. 13.

FIG. 14 shows a circuit 125 for slaving the voltage VK for adjusting the values of the resistances $R_0$ and $R_1$ of the channels of the PMOS transistors 68–71. This circuit 125 comprises four PMOS transistors 130–133 having their sources at the supply voltage VA, and their gates at the voltage VK delivered by a variable voltage generator 135. The transistors 130 and 131, which are each mounted in parallel with a respective capacitor 136, 137, are identical to the PMOS transistors 68, 71 of resistance $R_0$, and the transistors 132 and 133 are identical to the PMOS transistors 69, 70 of resistance $R_1=R_0(1-C_p/C_O)$. The drains of the transistors 130—133 are each linked to the output of a respective transconductance amplifier 140–143. The drains of the transistors 130 and 132 are furthermore linked to the inputs of the transconductance amplifiers 141 and 143 respectively. The slaving circuit 125 thus comprises two cascaded RC filters 138, 139, the first made up of the transconductance amplifier 140, the transistor 130 and the capacitor 136, and the second made up of the transconductance amplifier 141, the transistor 131 and the capacitor 137, and on the other hand two cascaded all-pass cells 148, 149, the first made up of the transconductance amplifier 142 and the transistor 132, and the second made up of the transconductance amplifier 143 and the transistor 133. The inputs of the transconductance amplifiers 140 and 142 receive a sinusoidal wave W of fixed frequency $f_1$ close to the intermediate frequency $f_I$. The drains of the transistors 131 and 133 are furthermore linked to the two inputs of a multiplier 145. The output of the multiplier 145 is linked to the input of a low-pass filter 146 having a cutoff frequency substantially below $f_1$. The output signal from the filter 146 is forwarded to the generator 135 in order to fix the value of the voltage VK. The transconductance amplifiers 140–143 can consist of Gilbert cells similar to the cells 12, 14 with a stage of npn transistors mounted in cascode in similar manner to the transistors 78–81 so as to exhibit a stray capacitance $C_p$ of the same order on the collectors of these npn transistors.

The capacitors 136 and 137 are sized so that their capacitance is $C'_O=C_O\cdot f_I/f_1$. Thus, the cascaded RC filters 138 and 139 each introduce at the frequency $f_1$ a phase-shift of $\Delta\phi+\pi/4$ when the voltage VK is at the proper value (that for which $2\pi f_I R_O(C_O-C_p)=1$ and $2\pi f_I R_1 C_O=1$. $\Delta\phi$ representing the phase-shift introduced by the cells 148, 149. The wave W being of the form $\sin 2\pi f_1 t$, the two inputs of the multiplier 145 are in quadrature when the voltage VK has the proper value, so that the output from the multiplier is at the frequency $2f_1$ and control of the variable generator 135 is not modified owing to the low-pass filtering. If, on the other hand, the voltage VK deviates from the proper value, the multiplier 145 delivers a DC component which, integrated by the filter 146, restores the voltage VK to the proper value.

The frequency $f_1$ of operation of the slaving circuit 125 would ideally be equal to the intermediate frequency $f_I$. However, since a sinusoidal wave is not necessarily available at the intermediate frequency, a readily available frequency $f_1$ is chosen which is close to $f_I$, by taking into account the difference in the capacitance $C'_O=C_O f_I/f_1$. In the case of an intermediate frequency of 10.7 MHz, it is for example possible to use a frequency $f_1$ of 11.15 MHz if a quartz resonating at this frequency is available.

In the case of a mixer device according to FIG. 11, that is to say when the stray capacitances may be regarded as negligible, there is no difference between the ohmic values of the resistors 30 and 34 ($R_0=R_1=R$), and a slaving circuit of the same kind as that of FIG. 14 can be used to slave the value of R when the identical resistors 30, 34 are variable resistors. The slaving then ensures that $2\pi RCf_I=1$ independently of outside fluctuations.

We claim:

1. Mixer device with image frequency rejection, comprising:

mixing means for forming a first signal by mixing an input radio signal with a first wave of frequency $fO$ delivered by a local oscillator and a second signal by mixing the input radio signal with a second wave of frequency $f_O$ delivered by the local oscillator and having a phase lag of 90° with respect to said first wave;

means of algebraic summation of third and fourth mutually phase-shifted signals obtained from said first and second signals, in order to produce an output signal possessing, at an intermediate frequency $f_I$, a phase representative of a phase possessed by the input radio signal at a communication frequency $f_C$ of the form $f_O-f_I$ or $f_O+f_I$, with rejection of the phase possessed by the input radio signal at an image frequency $2f_O-f_C$;

phase-shifter means producing said third signal by filtering an algebraic sum of the first and second signals with a transfer function A(f); and means for producing said fourth signal by applying to one of said first and second signals a transfer function B(f) such that, at the intermediate frequency $f_I$, the ratio $A(f_I)/B(f_I)$ has modulus $1/\sqrt{2}$ and argument $\pm 45°$ or $\pm 135°$.

2. Device according to claim 1, wherein the communication frequency $f_C$ is equal to $f_O-f_I$, and wherein the means of algebraic summation and the phase-shifter means are arranged so as to produce an output signal which, at the intermediate frequency $f_I$, is the real part of a complex signal proportional to $(X1+X2)e^{-j\pi/4}/\sqrt{2}-X1$, to $(X2-X1)e^{j\pi/4}/\sqrt{2}+X1$, to $(X1+X2)e^{j\pi/4}/\sqrt{2}-X2$ or to $(X2-X1)e^{-j\pi/4}/\sqrt{2}-X2$, X1 and X2 respectively denoting said first and second signals.

3. Device according to claim 1, wherein the communication frequency $f_C$ is equal to $f_0+f_1$, and wherein the means of algebraic summation and the phase-shifter means are arranged so as to produce an output signal which, at the intermediate frequency $f_I$, is the real part of a complex signal proportional to $(X1+X2)e^{-j\pi/4}/\sqrt{2}-X2$, to $(X1-X2)e^{j\pi/4}/\sqrt{2}+X2$, to $(X1+X2)e^{j\pi/4}/\sqrt{2}-X1$ or to $(X1-X2)e^{-j\pi/4}/\sqrt{2}-X1$, X1 and X2 respectively denoting said first and second signals.

4. Device according to claim 1, wherein the phase-shifter means comprise at least one RC filter without floating capacitance.

5. Device according to claim 4, wherein the RC filter comprises a first resistor and a capacitor which are connected in parallel between a first terminal to which a constant voltage is applied and a second terminal, and wherein two currents respectively representing said first and second signals are injected at said second terminal, the voltage present at said second terminal constituting said third signal delivered to the means of algebraic summation.

6. Device according to claim 5, further comprising a second resistor with ohmic value substantially equal to that of said first resistor, connected between said first terminal and a third terminal, and wherein a current representing said first signal or said second signal is injected at said third terminal, the voltage present at said third terminal constituting said fourth signal delivered to the means of algebraic summation.

7. Device according to claim 6, wherein the first and second resistors are substantially identical variable resistors whose ohmic value R is slaved so as to satisfy the relation $2\pi RCf_I=1$, where C is the capacitance of said capacitor.

8. Device according to claim 7, further comprising a circuit for slaving said variable resistors comprising two cascaded RC filters, each including a capacitor of capacitance $C.f_I/f_1$ in parallel with a variable resistor which is substantially identical to said first and second resistors, a sinusoidal wave of frequency $f_1$ of the same order as the intermediate frequency $f_I$ being applied to the two cascaded RC filters, the slaving circuit further including a multiplier receiving, on the one hand, said wave phase-shifted by the cascaded RC filters and, on the other hand, a non-phase-shifted version of said wave, and a low-pass filter receiving the output signal from the multiplier and having an output which adjusts the ohmic value of said variable resistors.

9. Device according to claim 4, wherein the mixing means comprise a first Gilbert cell yielding first and second currents whose difference represents the first signal, and a second Gilbert cell yielding third and fourth currents whose difference represents the second signal, wherein the phase-shifter means comprise first and second substantially identical resistors and first and second substantially identical capacitors, the first resistor and the first capacitor being mounted in parallel between a first terminal, to which a constant voltage is applied, and a second terminal, and the second resistor and the second capacitor being mounted in parallel between said first terminal and a third terminal, wherein the first and third currents are injected at said second terminal, whilst the second and fourth currents are injected at said third terminal, the difference between the voltage present at the third terminal and the voltage present at the second terminal representing said third signal, the device further including third and fourth substantially identical resistors, the third resistor being mounted between said first terminal and a fourth terminal, and the fourth resistor being mounted between said first terminal and a fifth terminal, and wherein the first and second currents or the third and fourth currents are respectively injected at said fourth terminal and at said fifth terminal, the difference between the voltage present at the fifth terminal and the voltage present at the fourth terminal representing said fourth signal.

10. Device according to claim 9, further comprising first, second, third and fourth bipolar transistors having respective bases at a constant voltage, the first and third currents being injected at the second terminal by way of the first bipolar transistor, the second and fourth currents being injected at the third terminal by way of the second bipolar transistor, the first current or the third current being injected at the fourth terminal by way of the third bipolar transistor, and the second current or the fourth current being injected at said fifth terminal by way of the fourth bipolar transistor.

11. Device according to claim 10, wherein the first, second, third and fourth resistors are sized in such a way that the ratio between an ohmic value of the third and fourth resistors and an ohmic value of the first and second resistors is $1-C_p/C_O$, where $C_O$ denotes the capacitance of the first and second capacitors, and $C_p$ denotes a stray capacitance present between the first terminal and each of the second, third, fourth and fifth terminals due to the bipolar transistors.

12. Device according to claim 11, wherein the first, second, third and fourth resistors are variable resistors slaved so that the ohmic value of the first and second resistors is $R_O=1/[2\pi(C_O-C_P)f_I]$ and that the ohmic value of the third and fourth resistors is $R_1=1/(2\pi C_O f_I)$.

13. Device according to claim 12, wherein said variable resistors consist of channels of respective MOS transistors having respective gates which receive an adjustment voltage.

14. Device according to claim 12, further comprising a circuit for slaving said variable resistors comprising two cascaded RC filters, each including a capacitor of capacitance $CO.f_I/f_1$, in parallel with a variable resistor which is substantially identical to said first and second variable resistors between said first terminal and an output of said RC filter, a sinusoidal wave of frequency $f_1$ of the same order as the intermediate frequency $f_I$ being applied to the two cascaded RC filters, the slaving circuit further including two cells each including a variable resistor which is substantially identical to said third and fourth variable resistors and is connected between said first terminal and an output of said cell, the wave of frequency $f_1$ being also applied to the two cascaded cells, and wherein the slaving circuit comprises a multiplier receiving two signals arising respectively from the cascaded RC filters and from the cascaded cells, and a low-pass filter having an input linked to an output of the multiplier and an output which controls the ohmic values of the first, second, third and fourth variable resistors and of the variable resistors of the slaving circuit.

15. Device according to claim 10, wherein the first, second, third and fourth bipolar transistors are npn transistors having respective collectors linked respectively to said second, third, fourth and fifth terminals and respective emitters linked to said first terminal by way of respective filtering capacitors of substantially smaller capacitances than that of said first and second capacitors.

* * * * *